United States Patent [19]
Ozeki

[11] Patent Number: 6,166,940
[45] Date of Patent: Dec. 26, 2000

[54] SEMICONDUCTOR MEMORY DEVICE HAVING A PLURALITY OF STORAGE REGIONS

[75] Inventor: Seiji Ozeki, Tokyo, Japan

[73] Assignee: NEC Corporation, Tokyo, Japan

[21] Appl. No.: 09/518,784

[22] Filed: Mar. 3, 2000

[30] Foreign Application Priority Data

Mar. 15, 1999 [JP] Japan .................................. 11-068249

[51] Int. Cl.⁷ ...................................................... G11C 5/02
[52] U.S. Cl. ............................................... 365/51; 365/63
[58] Field of Search .................................... 365/51, 63

[56] References Cited

U.S. PATENT DOCUMENTS

| | | | |
|---|---|---|---|
| 4,712,192 | 12/1987 | Tanimura et al. | 365/51 |
| 5,377,136 | 12/1994 | Nishio et al. | 365/63 |
| 5,602,771 | 2/1997 | Kajigaya et al. | 365/51 |

FOREIGN PATENT DOCUMENTS

| | | |
|---|---|---|
| 2-284449 | 11/1990 | Japan . |
| 3-48455 | 3/1991 | Japan . |
| 3-225697 | 10/1991 | Japan . |
| 8-306868 | 11/1996 | Japan . |

*Primary Examiner*—Trong Phan
*Attorney, Agent, or Firm*—Sughrue, Mion, Zinn, Macpeak & Seas, PLLC

[57] ABSTRACT

In a semiconductor memory device, a semiconductor chip has a plurality of storage regions, a circuit region, and a wiring region having a plurality of first signal lines and a plurality of second signal lines. Each second signal line is laid out between the first signal lines adjacent to each other and has a wiring length smaller than that of each first signal line. The wiring region has a portion where wiring lines are densely laid out and a portion where wiring lines are sparsely laid out. The second signal lines are laid out in the wiring region of the semiconductor chip while being separated from the first signal lines adjacent to the second signal lines by a minimum distance between signal lines or more, which is determined on the basis of a design rule. The plurality of first signal lines are laid out in the wiring region of the semiconductor chip at an interval (K) obtained by $K \geq 2S+L$ (where S is a value representing the minimum distance, and L is a value representing a wiring width of the second signal lines).

4 Claims, 5 Drawing Sheets

---- CIRCUIT OUTPUT SIDE
— FAR-END SIDE

FIG. 1D
PRIOR ART

---- CIRCUIT OUTPUT SIDE
— FAR-END SIDE

---- CIRCUIT OUTPUT SIDE
— FAR-END SIDE

FIG. 7D PRIOR ART

----- CIRCUIT OUTPUT SIDE
=== FAR-END SIDE

FIG. 8

SEMICONDUCTOR MEMORY DEVICE HAVING A PLURALITY OF STORAGE REGIONS

BACKGROUND OF THE INVENTION

1. Field of the Invention

The present invention relates to a semiconductor memory device and, more particularly, to a semiconductor memory device having a plurality of signal lines for transmitting a signal to a plurality of memory cells formed on a chip.

2. Description of the Prior Art

In the bus line of a conventional semiconductor memory device, signal output portions are collected to one position, and signal input portions are limited to a specific position of a memory cell array or decoder layout positions.

More specifically, this bus line is recognized not as wiring lines but as a wiring group of a bundle of lines. Hence, the bus line is also laid out as a wiring group of a bundle of lines. For example, like wiring lines other than the bus line, adjacent wiring lines are laid out at an interval based on a value "S" that represents the minimum distance between signal lines, which is determined on the basis of the design rule.

A parasitic capacitance C between adjacent wiring lines is given by $$C = 2 \times \epsilon \times t(LA/S + LB/S) = 2 \times \epsilon \times t(LA+LB)/S \quad (1)$$

where $\epsilon$ is the permittivity between signal lines, t is the height (thickness) of the signal line, LA is the wiring length of a signal line at a portion where wiring lines are densely laid out, LB is the wiring length of a signal line at a portion where wiring lines are sparsely laid out, and S is the value representing the minimum distance between signal lines, which is determined on the basis of the design rule.

FIGS. 1A to 1D show the operation of the semiconductor memory device which has the parasitic capacitance C obtained by substituting values into equation (1).

Figure 1A:
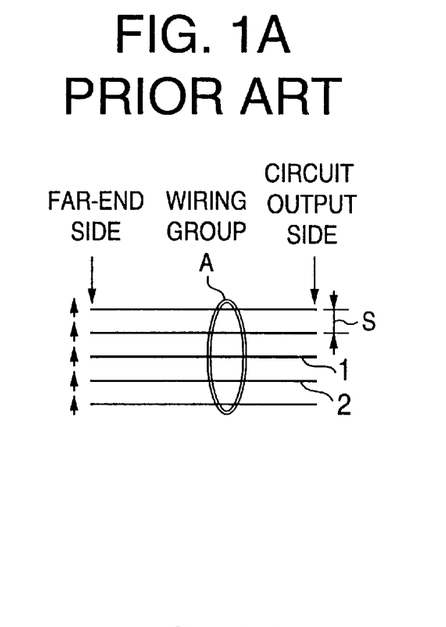
FIGS. 1A to 1D are views for explaining the operation of a conventional semiconductor memory device when it has a parasitic capacitance.
Figure 1B:
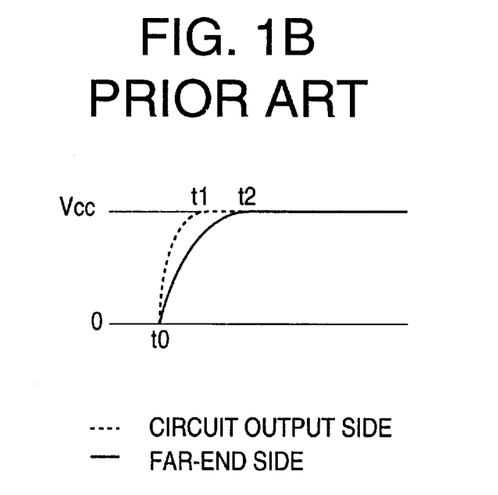

FIG. 1A shows a case wherein signals transmitted through wiring lines adjacent to each other in a wiring group A as a bus line are in phase (changes in level of signals transmitted through the wiring lines are in phase). FIG. 1B shows waveforms representing changes in level of signals.

Referring to FIG. 1B, a line segment indicated by a dotted line is a waveform representing a change in level of a signal on the circuit output side of a wiring line 1 of interest. A line segment indicated by a solid line is a waveform representing a change in level of the signal on the far-end side of the wiring line 1.

Since the wiring lines are of the same level, the parasitic capacitance between the wiring lines does not act as a capacitance. Hence, the delay time at the far-end portion when viewed from the circuit output portion is determined in accordance with the capacitance between the wiring line and the substrate.

The time until the level of the signal transmitted to the wiring line 1 of interest reaches a predetermined level Vcc, i.e., the delay time from reference time $t_0$ will be described. At the circuit output portion, the delay time is (time $t_1$–time t0). At the far-end portion, the delay time is (time t2–time t0).

Figure 1C:
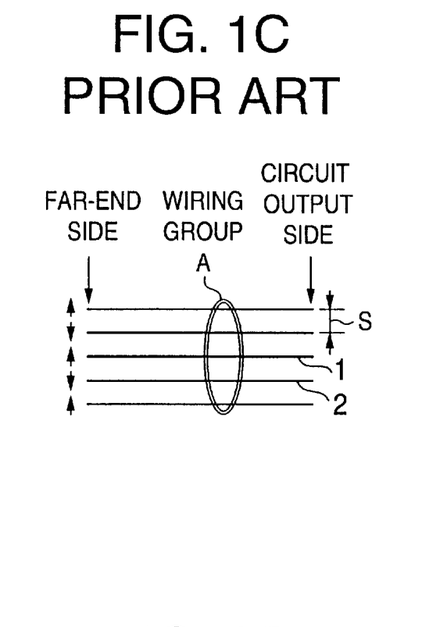
Figure 1D:
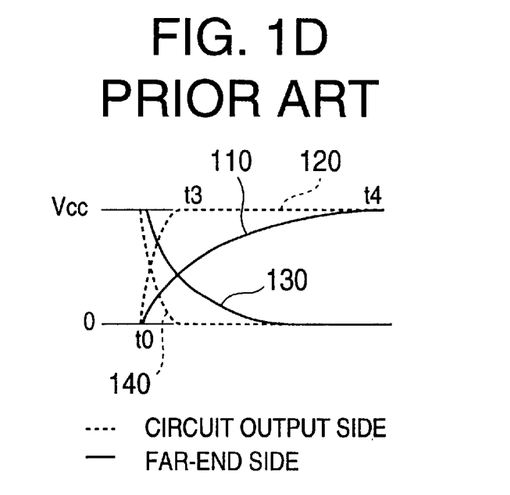

FIG. 1C shows a case wherein signals transmitted through wiring lines adjacent to each other in the wiring group A have opposite phases (changes in level of signals transmitted through the wiring lines have opposite phases). FIG. 1D shows waveforms representing changes in level of signals.

Referring to FIG. 1D, a line segment 120 indicated by a dotted line is a waveform representing a change in level of a signal on the circuit output side of the wiring line 1 of interest. A line segment 110 indicated by a solid line is a waveform representing a change in level of the signal on the far-end side of the wiring line 1.

The waveform whose level rises as the time elapses represents a change in level of the signal transmitted through the wiring line 1 of interest. Line segments 130 and 140 of waveforms whose level drops as the time elapses represent changes in level of the signal transmitted through a wiring line 2 adjacent to the wiring line 1.

As shown in FIG. 1C, since the signals transmitted through the wiring lines have different levels, the parasitic capacitance between the wiring lines acts as a capacitance. The capacitance of the entire wiring corresponds to the sum of the substrate capacitance and parasitic capacitance.

Hence, the delay time at the far-end portion when viewed from the circuit output portion is longer than that when the changes in level of signals transmitted through the wiring lines are in phase.

The time until the level of the signal transmitted by the wiring line 1 of interest reaches the predetermined level Vcc, i.e., the delay time from the reference time t0 will be described. At the circuit output portion, the delay time is (time t3–time t0). At the far-end portion, the delay time is (time t4–time t0).

When the delay time when the changes in level of the signals transmitted through the wiring lines are in phase is compared with that in opposite phases, time t3>time t1, and time t4>time t2 hold.

As devices that decrease the parasitic capacitance and shorten the delay time, devices disclosed in Japanese Unexamined Patent Publication No. 3-225697 (to be referred to as prior art 1 hereinafter) and Japanese Patent No. 2776551 (to be referred to as prior art 2 hereinafter) are known.

In the circuit disclosed in prior art 1, a power supply line or ground line is divided and laid out between signal lines to separate adjacent signal lines via the power supply lines or ground lines, thereby decreasing the mutual capacitance (i.e., parasitic capacitance).

In the device disclosed in prior art 2, the first signal line group for transmitting in-phase signals and the second signal line group for transmitting signals in phase opposite to that of the in-phase signals of the first signal line group are separated by a distance longer than that between signal lines in the same signal line group. With this arrangement, the influence of coupling noise is reduced at a portion where the signal lines for transmitting signals in opposite phases are adjacent to each other.

As described above, in the conventional semiconductor memory device, since the wiring lines of the bus line are laid out at the interval based on the minimum distance (S), the parasitic capacitance C obtained by substituting values into equation (1) is generated between the wiring lines.

For this reason, when the signals transmitted through the wiring lines adjacent to each other have opposite phases, the capacitance of the entire wiring equals to the sum of the substrate capacitance and parasitic capacitance.

Hence, the delay time at the far-end portion viewed from the circuit output portion is longer than that when the signals transmitted through the wiring lines adjacent to each other are in phase.

The wiring lines are laid out in a long distance while keeping the minimum wiring interval. In a high-frequency operation, the delay time becomes long at the far-end portion when viewed from the circuit output portion. Accordingly, the time until the signal becomes active is also delayed. For this reason, the memory operation at the far-end portion cannot follow up, resulting in degradation in access characteristics and the like.

For the devices disclosed in the prior arts, nothing has been taken into consideration about a technique of improving the memory performance, i.e., shortening the signal delay time by decreasing the parasitic capacitance when the signals transmitted through the wiring lines adjacent to each other in the bus line (a plurality of wiring lines) have opposite phases.

For this reason, if the signals transmitted through the wiring lines adjacent to each other are in opposite phases, it is difficult to improve the memory characteristics.

SUMMARY OF THE INVENTION

The present invention has been made in consideration of the above situation of the prior arts, and has as its object to provide a semiconductor memory device which can decrease the parasitic capacitance between signal lines and shorten the signal delay time even when signals transmitted through signal lines adjacent to each other in a plurality of wiring lines such as a bus line have opposite phases.

In order to achieve the above object, according to the main aspect of the present invention, there is provided a semiconductor memory device comprising:

a semiconductor chip having a plurality of storage regions for storing data, a circuit region where circuits for accessing the plurality of storage regions, including an address decoder, are arranged, and a wiring region having a plurality of first signal lines for transmitting signals to the plurality of storage regions, and a plurality of second signal lines for transmitting signals to the circuit region, each of the second signal lines being laid out between the first signal lines and having a wiring length shorter than that of each of the first signal lines, wherein the wiring region has a portion where wiring lines are densely laid out by laying out the plurality of first signal lines and the plurality of second signal lines, and a portion where wiring lines are sparsely laid out by laying out only the first signal lines, wherein the second signal lines laid out between the first signal lines adjacent to each other are laid out in the wiring region of the semiconductor chip while being separated from the first signal lines adjacent to the second signal lines by a distance not less than a minimum distance between signal lines, which is determined on the basis of a design rule, and wherein the plurality of first signal lines are laid out in the wiring region of the semiconductor chip at an interval (K) obtained by $$K \geq 2S + L$$

(where S is a value representing the minimum distance, and L is a value representing a wiring width of the second signal lines).

In this semiconductor memory device, in the wiring region of the semiconductor chip having the portion where the wiring lines are densely laid out and the portion where the wiring lines are sparsely laid out, at the portion where the wiring lines are densely laid out, the second signal lines having small wiring lengths are laid out between the signal lines of the plurality of first signal lines (e.g., a signal line group serving as a bus line and access line) for transmitting signals to the plurality of storage regions (e.g., memory cell arrays). The second signal lines are laid out in the wiring region of the semiconductor chip while being separated from the first signal lines adjacent to the second signal lines by the minimum distance (S) or more.

The plurality of first signal lines are laid out in the wiring region of the semiconductor chip at the interval (K) represented by the above inequality.

At the portion where the wiring lines are densely laid out, the interval between the first signal lines is the minimum distance (S), and the parasitic capacitance is the same as that of the prior art. However, at the portion where the wiring lines are sparsely laid out, the interval between the first signal lines is twice or more the minimum distance, and the parasitic capacitance is ½ or less that of the prior art. Hence, as the entire signal lines in the wiring region of the semiconductor chip, the parasitic capacitance between the signal lines can be greatly decreased as compared to the prior art.

In the semiconductor memory device according to the main aspect, at the portion where the wiring lines are sparsely laid out, the second signal line to be laid out is laid out in the wiring region of the semiconductor chip outside an outermost signal line of the plurality of first signal lines while being separated from a first signal line adjacent to the second signal line by the distance not less than the minimum distance (S).

In addition, in the semiconductor memory device according to the main aspect, the wiring region of the semiconductor chip further comprises a third signal line having a wiring length as long as that of the plurality of first signal lines to transmit a signal of a predetermined level, the third signal line being laid out in the wiring region of the semiconductor chip outside an outermost signal line of the plurality of first signal lines while being separated from a signal line adjacent to the third signal line by the distance not less than the minimum distance (S).

In the above semiconductor memory device, the second signal lines having small wiring lengths are laid out in the wiring region of the semiconductor chip between the first signal lines at the portion where the wiring lines are densely laid out and outside the outermost signal line of the first signal lines at the portion where the wiring lines are sparsely laid out while being separated from the signal lines adjacent to the second signal line by the minimum distance (S) or more.

The third signal line having a large wiring length is laid out in the wiring region of the semiconductor chip outside the outermost signal line of the plurality of first signal lines while being separated from the first or second signal line adjacent to the third signal line by the minimum distance (S) or more.

Hence, as described above, as the entire signal lines in the wiring region of the semiconductor chip, the parasitic capacitance between the signal lines can be greatly decreased as compared to the prior art.

In addition, since the parasitic capacitance between the plurality of first signal lines can be decreased, the time constant can be made small. Since the time constant can be made small, the delay time of signals transmitted by the signal line groups can be shortened.

The above and many other objects, features and advantages of the present invention will become manifest to those skilled in the art upon making reference to the following detailed description and accompanying drawings in which preferred embodiments incorporating the principle of the invention are shown by way of illustrative examples.

DETAILED DESCRIPTION OF THE PREFERRED EMBODIMENTS

A semiconductor memory device according to an embodiment of the present invention will be described below with reference to the accompanying drawings.

Figure 2:
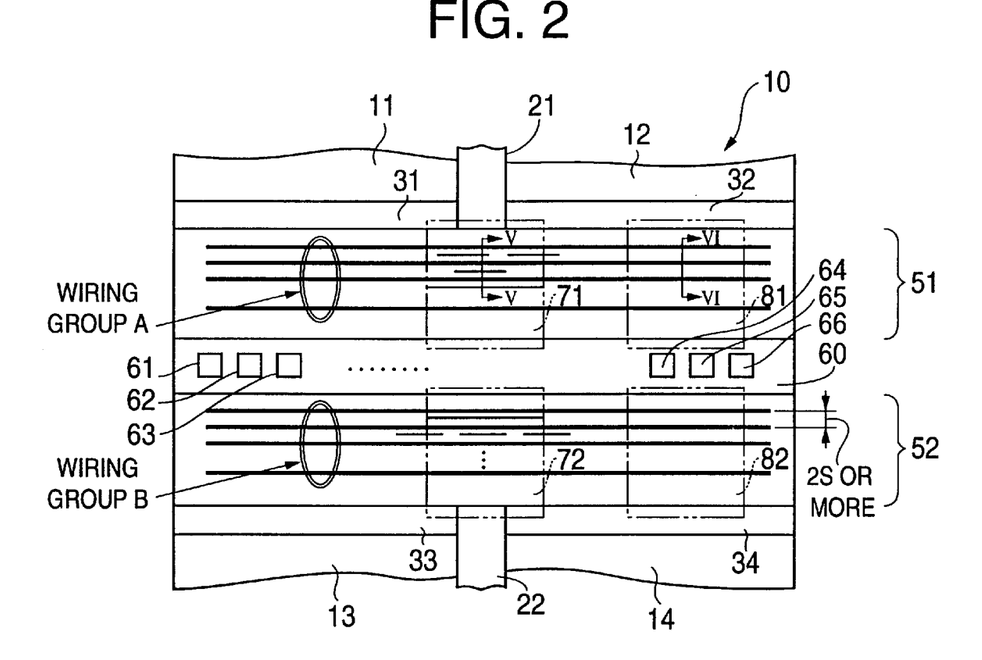
FIG. 2 is a view showing the layout of a semiconductor memory device according to an embodiment of the present invention.

FIG. 2 is a view showing the layout of the semiconductor memory device according to this embodiment.

As shown in FIG. 2, the semiconductor memory device has a chip 10. The chip 10 is constructed by four divided memory cell arrays 11 to 14, row decoders 21 and 22, column decoders/circuit regions 31 to 34, wiring regions 51 and 52, and pad region 60.

The pad region 60 is formed at the center of the chip 10. The wiring regions 51 and 52 are adjacent to the pad region 60.

The row decoder 21 is arranged between the memory cell array 11 and the memory cell array 12. The row decoder 22 is arranged between the memory cell array 13 and the memory cell array 14.

The column decoder/circuit region 31 is arranged between the memory cell array 11 and the wiring region 51. The column decoder/circuit region 32 is arranged between the memory cell array 12 and the wiring region 51. The column decoder/circuit region 33 is arranged between the memory cell array 13 and the wiring region 52. The column decoder/circuit region 34 is arranged between the memory cell array 14 and the wiring region 52.

Pads 61 to 63 are arranged parallel to the column decoders/circuit regions 31 and 33. Pads 64 to 66 are arranged parallel to the column decoders/circuit regions 32 and 34.

In the wiring regions 51 and 52, wiring lines are laid out parallel to the pad region 60, i.e., the pads.

The wiring lines are classified into a total of four types: two types according to the "difference in distance" and two types according to the "difference in operation".

When the wiring lines are classified depending on the "difference in distance", they are classified into wiring lines (to be referred to as a bus line hereinafter) laid out across the chip to transmit a common signal group to the memory cell arrays and wiring lines provided to connect only adjacent circuits and transmit signals between the circuits.

When the wiring lines are classified depending on the "difference in operation", they are classified into wiring lines (to be referred to as an access bus hereinafter) for transmitting a signal used to perform high-speed memory operation for an externally input signal and wiring lines for transmitting a signal kept fixed at a predetermined level such as a power supply voltage level or ground voltage level.

In this embodiment, a plurality of wiring lines serving as a bus line and access line are defined as wiring groups A and B. The wiring group A is laid out in the wiring region 51, while the wiring group B is laid out in the wiring region 52.

In laying out the wiring groups, the interval between adjacent wiring lines is set at a value (distance) twice (to be represented by "2S" hereinafter) or more of a value (to be represented by "S" hereinafter) representing the minimum distance between the signal lines, which is determined on the basis of the design rule.

Note that the design rule is a rule (e.g., the 0.45-$\mu$m rule) determined when a semiconductor memory device (product) is developed.

After the minimum values of the wiring interval, transistor gate length, and the like are determined in accordance with the design rule, the value "S" representing the minimum distance is determined, in design, to be optimum from both viewpoints of chip area and characteristics. After that, products are manufactured on the trial basis and subjected to various tests, thereby adjusting the value "S" to the optimum value.

The wiring regions 51 and 52 have a limited width. For this reason, the wiring lines are laid out densely at portions 71 and 72 where various wiring lines are laid out at the central portion of the chip 10, and sparsely at portions 81 and 82 close to the end to the chip 10. The wiring regions 51 and 52 have a multilayered structure in which layers are insulated from each other.

Figure 3:
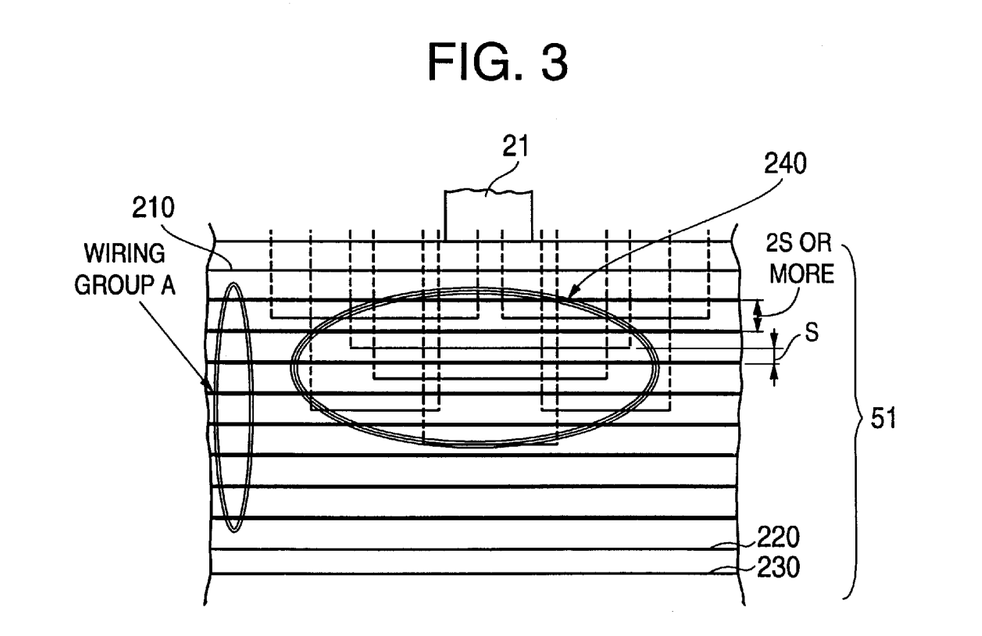
FIG. 3 is an enlarged view of a portion where wiring lines are densely laid out.
Figure 4:
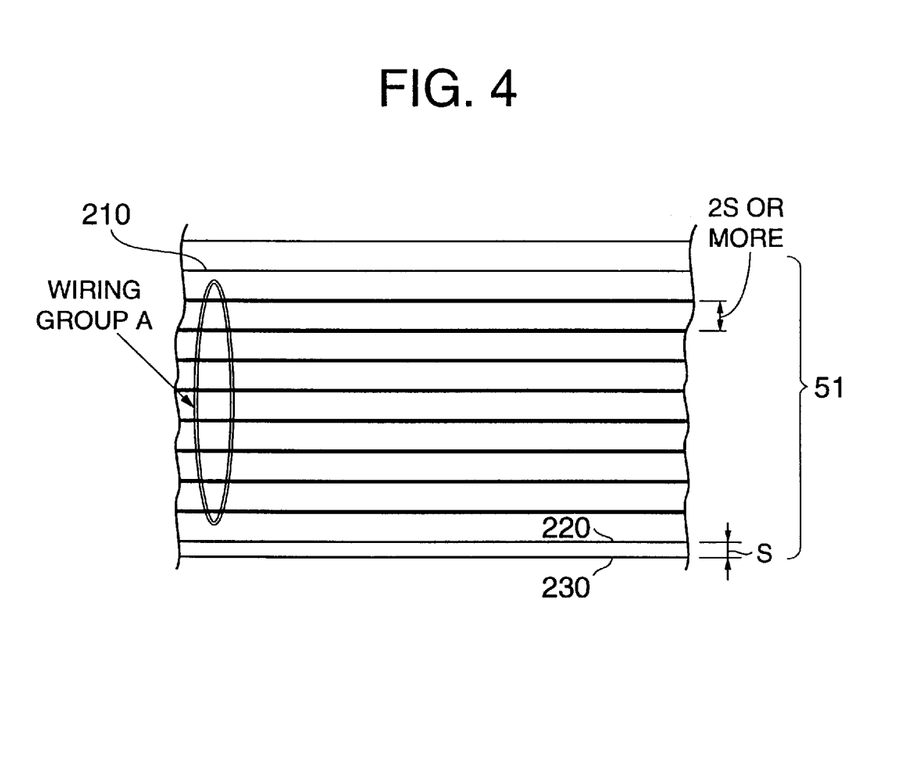
FIG. 4 is an enlarged view of a portion where wiring lines are sparsely laid out.

FIG. 3 is an enlarged view of the portion 71 where the wiring lines are densely laid out, and FIG. 4 is an enlarged view of the portion 81 where the wiring lines are sparsely laid out.

At the dense portion 71, wiring lines 210, 220, and 230 other than the wiring group A, which have a relatively large wiring length, are laid out outside the wiring group A, as shown in FIG. 3.

Wiring lines including wiring lines 240 in FIG. 3, which have relatively small wiring lengths, are laid out between the wiring lines of the wiring group A. The short wiring lines include, e.g., wiring lines such as extraction lines (indicated by thin solid lines and dotted lines in FIG. 3) from circuits in the circuit region, which have relatively small wiring lengths.

In this case, when the interval "2S or more" of the wiring group A is set to be an interval "(2S+value equal to or larger than the wiring width of a wiring line having a small wiring length)", the interval between each wiring line of the wiring group A and each wiring line having a small wiring length has the minimum value "S". For this reason, other wiring lines can be laid out between the wiring lines of the wiring group A.

For example, in the wiring lines 240 having small wiring lengths, wiring lines (second wiring lines) laid out parallel to the wiring group A (first wiring lines) are formed in the wiring region 51 in the same layer as that in which the wiring group A is laid out. That is, the wiring group A and the second wiring lines are formed in the same layer.

The wiring lines 210, 220, and 230 laid out outside the wiring group A are called third wiring lines.

In addition, wiring lines (fourth wiring lines) perpendicular to the wiring group A are formed in the wiring region 51 in a layer different from that in which the wiring group A is formed. That is, the wiring group A and the fourth wiring lines are formed in different layers.

In the wiring region 51 shown in FIG. 3, the fourth wiring lines correspond to extraction lines from the row decoder 21 and column decoders/circuit regions 31 and 32.

The second wiring lines and fourth wiring lines, which are formed in different layers, are electrically connected via through holes.

In this embodiment, the resistance value of the wiring lines of the wiring groups A and B and that of the wiring lines 240 having small wiring lengths are set at almost equal small values. More specifically, the wiring groups A and B and wiring lines having small wiring lengths, which have small resistance values, are formed in the same layer in the multilayered structure of the wiring region 51.

As shown in FIG. 4, at the sparse portion 81, the wiring lines 210, 220, and 230 are laid out outside the wiring group A.

The wiring group B is also laid out in the wiring region 52, like the wiring group A. The portions where wiring lines are laid out densely and sparsely also have the same layouts as those of the wiring group A.

Next, the parasitic capacitance of the wiring group A will be obtained about each of the portion 71 shown in FIG. 3 where the wiring lines are densely laid out and the portion 81 shown in FIG. 4 where the wiring lines are sparsely laid out.

Figure 5:
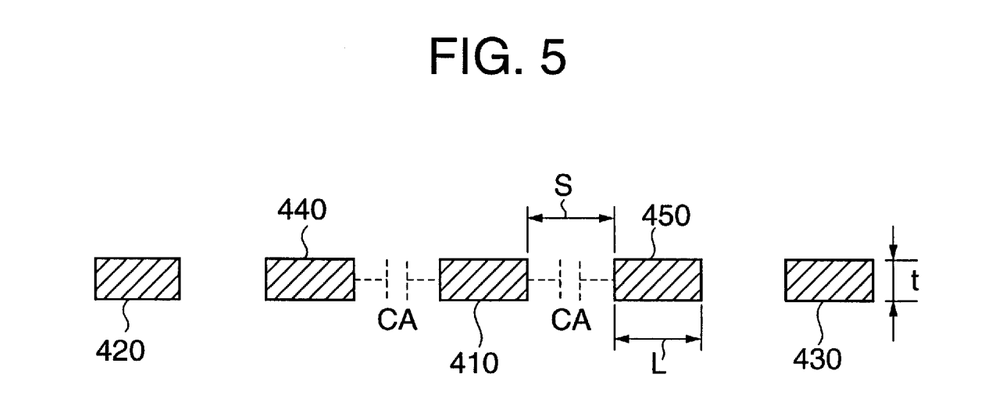
FIG. 5 is a sectional view taken along a line V—V in FIG. 2.
Figure 6:
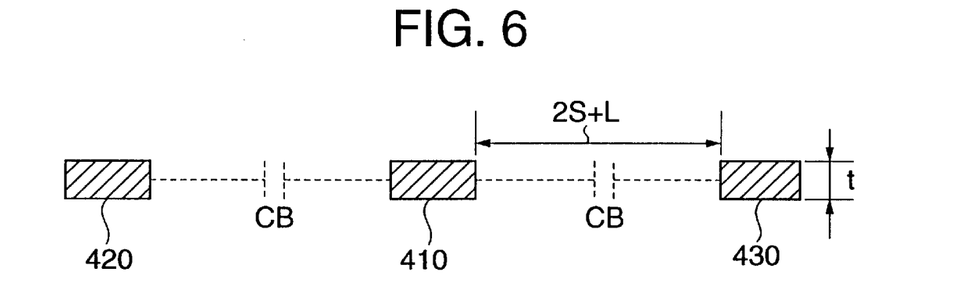
FIG. 6 is a sectional view taken along a line VI—VI in FIG. 2.

FIG. 5 is a sectional view of the wiring lines at the portion 71 shown in FIG. 3 where the wiring lines are densely laid out. FIG. 6 is a sectional view of the wiring lines at the portion 81 shown in FIG. 4 where the wiring lines are sparsely laid out.

Referring to FIG. 5, reference numerals 410, 420, and 430 denote sections of some wiring lines of the wiring group A; and 440 and 450, sections of wiring lines (e.g., extraction lines from circuits) having small wiring lengths (wiring distances).

At the portion 71 where the wiring lines are densely laid out, the wiring lines having small wiring lengths are laid out between the wiring lines of the wiring group A. Hence, as shown in FIG. 5, the wiring line 410 of interest in the wiring group A has, on both sides, the wiring lines 440 and 450 having small wiring lengths at the wiring interval S.

Let "t" be the height (thickness) of the wiring line, and "$\epsilon$" be the permittivity between the wiring lines. When the parasitic capacitance can be approximately expressed as a parallel plate, a parasitic capacitance CA per unit length is given by $$CA = \epsilon \times t/S \quad (2)$$

Since the parasitic capacitance CA is present on both sides of the wiring line 410 of interest, the total parasitic capacitance is obtained from equation (2) as follows.

$$2 \times CA = 2 \times \epsilon \times t/S \quad (3)$$

The parasitic capacitance C of the wiring group A at the portion 81 where the wiring lines are sparsely laid out will be obtained.

Referring to FIG. 6, reference numerals 410, 420, and 430 denote sections of some wiring lines of the wiring group A.

At the portion 81 where the wiring lines are sparsely laid out, no wiring lines are present between the wiring lines of the wiring group A. Hence, as shown in FIG. 6, the wiring lines 420 and 430 of the wiring group A are laid out on both sides of the wiring line 410 of interest of the wiring group A.

The interval between the wiring line 410 of interest, the wiring line 420, and the wiring line 430 equals the wiring interval of the wiring group A at the portion 71 where the wiring lines are densely laid out. For this reason, letting "L" be the wiring width of a wiring line shorter than the wiring lines of the wiring group A, e.g., the wiring width of the shown in FIG. 5, the wiring interval is represented by "2S+L".

A parasitic capacitance CB per unit length is given by:

$$CB = \epsilon \times t/(2S+L) \quad (4)$$

Since the parasitic capacitance CB is present on both sides of the wiring line 410 of interest, the total parasitic capacitance is given by:

$$2 \times CB = 2 \times \epsilon \times t/(2S+L) \quad (5)$$

The wiring lines of the wiring group A has the layouts shown in FIGS. 3 and 4. Letting "LA" be the wiring length of the wiring line at the dense portion, and "LB" be the wiring length of the wiring line at the sparse portion, the total parasitic capacitance C of the wiring line of interest is given by:

$$C = 2 \times (CA \times LA + CB \times LB) \quad (6)$$

Substitutions of equations (3) and (5) into equation (6) yield:

$$C = 2 \times \epsilon \times t \times \{LA/S + LB/(2S+L)\} \quad (7)$$

When the wiring length "LA" of the wiring line at the dense portion is much smaller than the wiring length "LB" of the wiring line at the sparse portion (LA<<LB), from equation (7), equation (8) is given $$C \approx 2 \times \epsilon \times t \times LB/(2S+L) \quad (8)$$

FIGS. 7A to 7D show the operation of the semiconductor memory device when it has the parasitic capacitance C obtained by substituting values into equation (8).

Figure 7A:
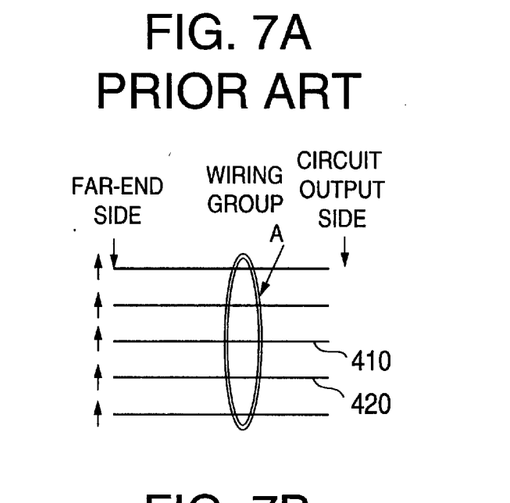
FIGS. 7A to 7D are views for explaining the operation of a semiconductor memory device when the semiconductor memory device shown in FIG. 2 has a parasitic capacitance.
Figure 7B:
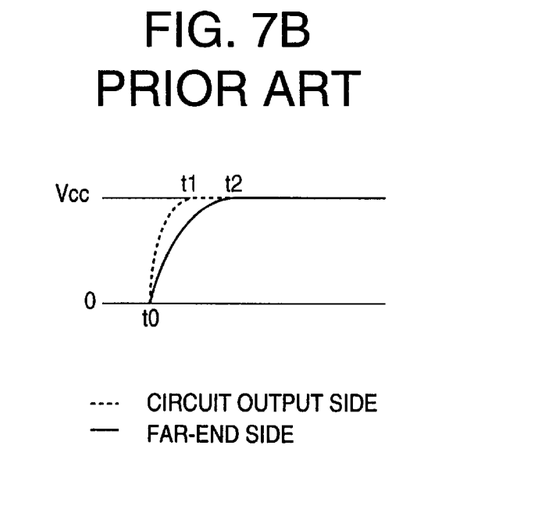

FIG. 7A shows a case wherein signals transmitted through the wiring lines of the wiring group A are in phase (changes in level of signals transmitted through the wiring lines are in phase). FIG. 7B shows waveforms representing changes in level of signals.

Referring to FIG. 7B, a line segment indicated by a dotted line is a waveform representing a change in level of a signal on the circuit output side of the wiring line 410 of interest. A line segment indicated by a solid line is a waveform representing a change in level of the signal on the far-end side of the wiring line 410.

When the changes in level of signals transmitted through the wiring lines are in phase, the signals transmitted through the wiring lines are of the same level, and the parasitic capacitance between the wiring lines does not act as a capacitance.

Hence, the delay time at the far-end portion when viewed from the circuit output portion is determined in accordance with the capacitance (to be referred to as a substrate capacitance hereinafter) between the wiring line and the substrate.

The time until the level of the signal transmitted to the wiring line 410 of interest reaches a predetermined level Vcc, i.e., the delay time from reference time t0 will be described. At the circuit output portion, the delay time is (time t1−time t0). At the far-end portion, the delay time is (time t2−time t0). These waveforms are the same as those shown in FIGS. 1A and 1B (the characteristics are the same as those shown in FIGS. 1A and 1B).

Figure 7C:
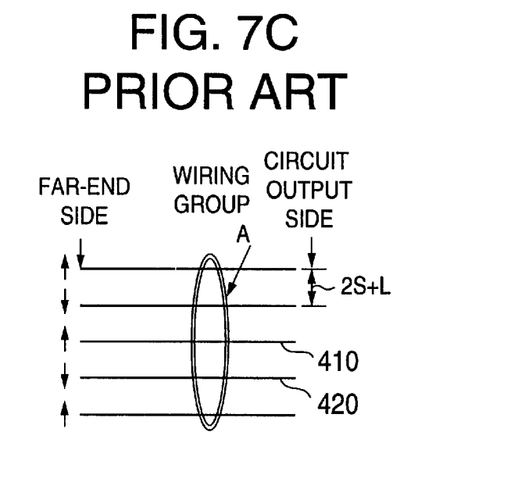
Figure 7D:
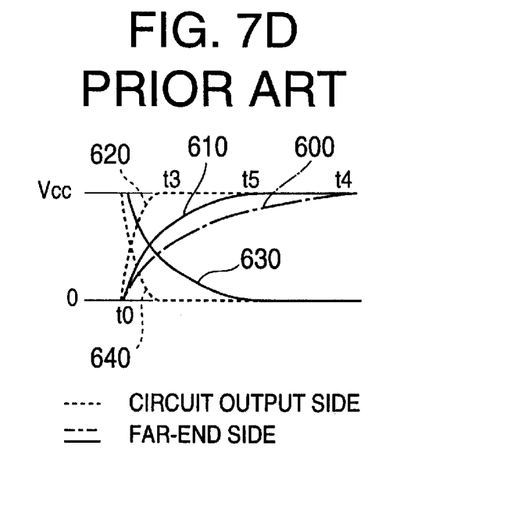

FIG. 7C shows a case wherein signals transmitted through the wiring lines have opposite phases (changes in level of signals transmitted through the wiring lines are in opposite phases). FIG. 7D shows waveforms representing changes in level of signals.

Referring to FIG. 7D, reference numeral 610 denotes a waveform representing a change in level of a signal at the far-end portion of the wiring line 410 shown in FIG. 7C. Reference numeral 600 denotes a waveform representing a change in level of the signal at the far-end portion of the wiring line 1 of interest shown in FIG. 1D. Reference numeral 620 denotes a waveform representing a change in level of the signal on the circuit output side of the wiring line 410 shown in FIG. 7C.

In the waveforms shown in FIG. 7D, a line segment 630 indicated by a solid line is a waveform representing a change in level of the signal at the far-end portion of a wiring line adjacent to the wiring line 410, e.g., the wiring line 420. A line segment 640 indicated by a dotted line is a waveform representing a change in level of the signal on the circuit output side of the wiring line 420.

When the changes in level of the signals transmitted through the wiring lines are in opposite phases, the signals transmitted to the wiring lines of the wiring group A have different levels. For this reason, the parasitic capacitance between the wiring lines acts as a capacitance, and the capacitance of the entire wiring corresponds to the sum of the substrate capacitance and parasitic capacitance.

Hence, the delay time at the far-end portion when viewed from the circuit output portion is longer than that when the changes in level of signals transmitted through the wiring lines are in phase.

However, when the wiring lines of the wiring group A are uniformly laid out at the wiring interval "2S", the parasitic capacitance is about ½ that of the prior art. For this reason, the time constant becomes smaller than that of the prior art, and consequently, the delay time is shortened.

The time until the level of the signal transmitted by the wiring line 410 of interest reaches the predetermined level Vcc, i.e., the delay time from the reference time t0 will be described. At the circuit output portion, the delay time is (time t3−time t0). At the far-end portion, the delay time is (time t5−time t0).

When the delay time when the changes in level of the signals transmitted through the wiring lines are in phase is compared with that in opposite phases, time t3>time t1, and time t5>time t2 hold.

In addition, the delay time on the far-end side of the wiring line 410 of interest will be compared with that of the prior art. As is apparent from FIG. 7D, in this embodiment, the change in level of the signal is represented by the waveform 610, and in the prior art, the change in level of the signal is represented by the waveform 620. Hence, the delay times have a relationship of time t5<time t4.

The delay time of this embodiment is shorter than that of the prior art because each wiring capacitance of the signal line group A is made smaller than that of the prior art, and the time constant becomes small, as described above.

In the wiring group B as well, each capacitance can be totally decreased by the same layout as described above.

As described above, according to this embodiment, the wiring interval of the wiring group A can be increased without increasing the wiring region (i.e., without increasing the size of the semiconductor chip). This is because at the portion where the wiring lines are densely laid out, wiring lines shorter than the wiring group A are laid out between the wiring lines of the wiring group A.

The wiring interval is the same as that of the prior art only at the portion where the wiring lines are densely laid out. At the portion where the wiring lines are sparsely laid out, the wiring interval is doubled as compared to the prior art. In addition, since the wiring length of each wiring line is small at the portion where the wiring lines are densely laid out, the parasitic capacitance between the wiring lines is about ½ that of the prior art as a whole.

Since each wiring capacitance in the wiring groups A and B is decreased as compared to the prior art, and the time constant becomes small, the delay time of signals transmitted by the wiring groups A and B is shortened, and the characteristics of memory operation can be improved.

A semiconductor memory device according to the second embodiment of the present invention will be described next.

Figure 8:
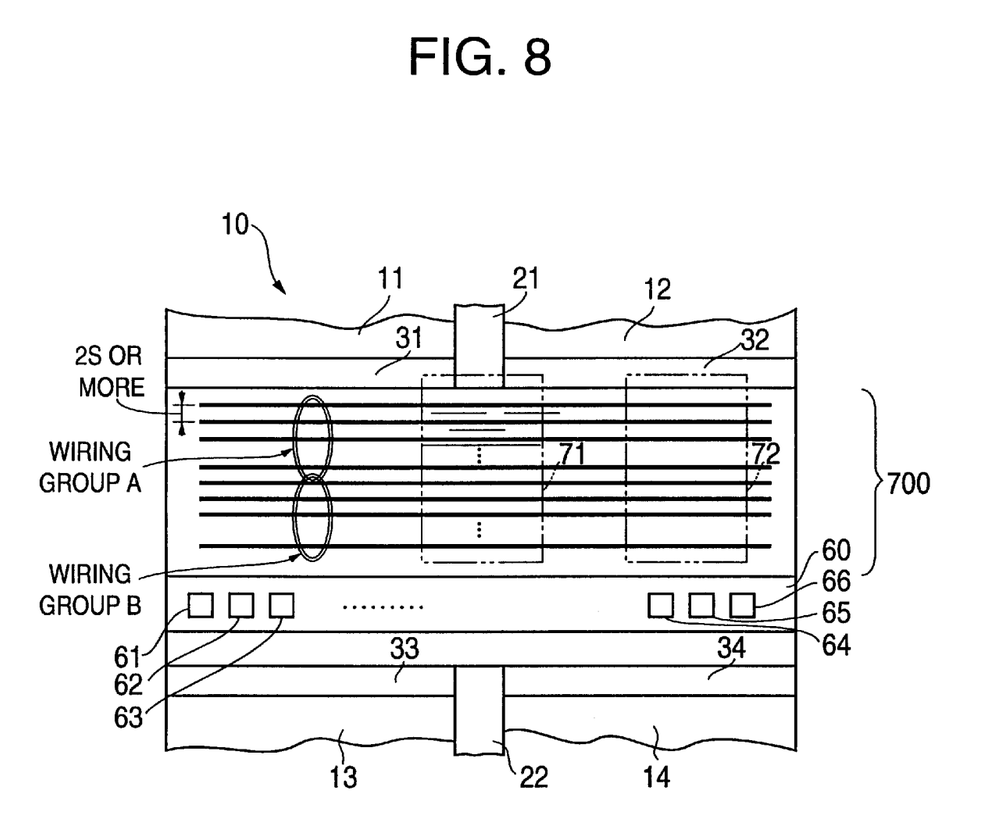
FIG. 8 is a view showing the layout of a semiconductor memory device according to another embodiment of the present invention.

FIG. 8 is a view showing the layout of the semiconductor memory device according to the second embodiment of the present invention.

FIG. 8 shows an arrangement in which the wiring region 52 of the arrangement shown in FIG. 2 is omitted, and the wiring region 51 is changed to a wiring region 700. The same reference numerals as in FIG. 2 denote the same parts in FIG. 8.

In the wiring region 700, a wiring group A and wiring group B shown in FIG. 2 are adjacent t o each other.

Let "S" be the value representing the minimum distance between signal lines, which is determined on the basis of the design rule, and "L" be the wiring width of a wiring line having a small wiring length. When the wiring groups A and B are present in the wiring region 700, the wiring interval in each wiring group is set at "2S+L", and the interval between the wiring group A and the wiring group B is also set at "2S+L".

This is because when the wiring group A and wiring group B are adjacent to each other, these wiring groups can be regarded as one wiring group.

Hence, as described in the first embodiment, at a portion 71 where the wiring lines are densely laid out, wiring lines having small wiring lengths are laid out between wiring lines in both of the wiring groups A and B, as shown in FIG. 3. At a portion 72 where the wiring lines are sparsely laid out, both the wiring lines having large wiring lengths and wiring lines having small wiring lengths are laid out outside the wiring groups A and B, as shown in FIG. 4.

For this reason, the decrease amount of the parasitic capacitance and that of the delay time in the layout shown in FIG. 8 are the same as those of the first embodiment.

More specifically, in the second embodiment as well, each parasitic capacitance in the wiring groups A and B is decreased as compared to the prior art, and the time constant becomes small. Hence, the delay time of signals transmitted by the wiring groups A and B is shortened, and the characteristics of memory operation can be improved.

What is claimed is:

1. A semiconductor memory device comprising:

a semiconductor chip having a plurality of storage regions for storing data, a circuit region where circuits for accessing the plurality of storage regions, including an address decoder, are arranged, and a wiring region having a plurality of first signal lines for transmitting signals to the plurality of storage regions, and a plurality of second signal lines for transmitting signals to the circuit region, each of said second signal lines being laid out between said first signal lines adjacent to each other and having a wiring length shorter than that of each of said first signal lines, wherein the wiring region has a portion where wiring lines are densely laid out by laying out said plurality of first signal lines and said plurality of second signal lines, and a portion where wiring lines are sparsely laid out by laying out only said first signal lines, wherein said second signal lines laid out between said first signal lines adjacent to each other are laid out in the wiring region of said semiconductor chip while being separated from said first signal lines adjacent to said second signal lines by a distance not less than a minimum distance between signal lines, which is determined on the basis of a design rule, and wherein said plurality of first signal lines are laid out in the wiring region of said semiconductor chip at an interval (K) obtained by $K \geq 2S+L$ (where S is a value representing the minimum distance, and L is a value representing a wiring width of said second signal lines).

2. A device according to claim 1, wherein at the portion where said wiring lines are sparsely laid out, a wiring line having a relatively large wiring length is laid out in the wiring region of said semiconductor chip outside an outermost signal line of said plurality of first signal lines while being separated from a first signal line adjacent to said wiring line by the distance not less than the minimum distance (S).

3. A device according to claim 1, wherein the wiring region of said semiconductor chip further comprises a third signal line having a wiring length as long as that of said plurality of first signal lines to transmit a signal of a predetermined level, said third signal line being laid out in the wiring region of said semiconductor chip outside an outermost signal line of said plurality of first signal lines while being separated from a signal line adjacent to said third signal line by the distance not less than the minimum distance (S).

4. A device according to claim 2, wherein the wiring region of said semiconductor chip further comprises a third signal line having a wiring length as long as that of said plurality of first signal lines to transmit a signal of a predetermined level, said third signal line being laid out in the wiring region of said semiconductor chip outside an outermost signal line of said plurality of first signal lines while being separated from a signal line adjacent to said third signal line by the distance not less than the minimum distance (S).

* * * * *